(12) United States Patent
Doebber et al.

(10) Patent No.: US 10,145,003 B2
(45) Date of Patent: Dec. 4, 2018

(54) CMAS-INERT THERMAL BARRIER LAYER AND METHOD FOR PRODUCING THE SAME

(71) Applicant: MTU Aero Engines AG, Munich (DE)

(72) Inventors: Philipp Doebber, Hannover (DE); Joachim Bamberg, Dachau (DE); Stefan Schneiderbanger, Dachau (DE); Thomas Bautsch, Hannover (DE)

(73) Assignee: MTU AERO ENGINES AG, Munich (DE)

( * ) Notice: Subject to any disclaimer, the term of this patent is extended or adjusted under 35 U.S.C. 154(b) by 147 days.

(21) Appl. No.: 14/327,997

(22) Filed: Jul. 10, 2014

(65) Prior Publication Data
US 2015/0014179 A1    Jan. 15, 2015

(30) Foreign Application Priority Data
Jul. 12, 2013   (DE) .................. 10 2013 213 742

(51) Int. Cl.
*C23C 16/00* (2006.01)
*C23C 14/08* (2006.01)
(Continued)

(52) U.S. Cl.
CPC ............... *C23C 14/08* (2013.01); *C23C 4/02* (2013.01); *C23C 4/11* (2016.01); *C23C 4/18* (2013.01); *C23C 14/081* (2013.01); *C23C 14/083* (2013.01); *C23C 14/34* (2013.01); *C23C 18/1208* (2013.01); *C23C 18/1216* (2013.01); *C23C 18/1254* (2013.01); *C23C 18/1295* (2013.01); *C23C 28/042* (2013.01); *C23C 28/048* (2013.01); *C23C 28/32* (2013.01); *C23C 28/3455* (2013.01); *C25D 7/008* (2013.01);
(Continued)

(58) Field of Classification Search
CPC ..... C23C 14/08; C23C 14/081; C23C 14/083; C23C 14/34
See application file for complete search history.

(56) References Cited

U.S. PATENT DOCUMENTS 4,916,022 A * 4/1990 Solfest .................. C23C 14/083
416/241 B
5,338,577 A     8/1994 Burdette, II
(Continued)

FOREIGN PATENT DOCUMENTS

EP    0783043 A1   7/1997
EP    1225251 A2   7/2002
(Continued)

OTHER PUBLICATIONS

Drexler J., et al., "Air-Plasma-sprayed thermal barrier coatings that are resistant to high-temperature attack by glassy deposits", Acta Materialia 58 (2010), pp. 6835 to 6844.

*Primary Examiner* — Kelly M Gambetta
(74) *Attorney, Agent, or Firm* — Abel Law Group, LLP

(57) ABSTRACT

Disclosed are a method for forming a thermal barrier layer for a metallic component, which method involves forming a ceramic coat in which at least in part aluminum oxide and titanium oxide are disposed, the aluminum oxide and the titanium oxide being introduced by infiltration of aluminum-containing and titanium-containing particles or substances or by physical vapor deposition.

19 Claims, 3 Drawing Sheets

(51) Int. Cl.
 *C23C 14/34* (2006.01)
 *C25D 9/04* (2006.01)
 *C25D 13/02* (2006.01)
 *F16L 59/02* (2006.01)
 *C23C 18/12* (2006.01)
 *C25D 7/00* (2006.01)
 *C23C 4/02* (2006.01)
 *C23C 4/18* (2006.01)
 *C23C 28/04* (2006.01)
 *C23C 28/00* (2006.01)
 *C23C 4/11* (2016.01)

(52) U.S. Cl.
 CPC .............. *C25D 9/04* (2013.01); *C25D 13/02* (2013.01); *F16L 59/028* (2013.01)

(56) References Cited

U.S. PATENT DOCUMENTS

| | | | |
|---|---|---|---|
| 5,660,885 A | 8/1997 | Hasz et al. | |
| 5,683,761 A * | 11/1997 | Bruce | C23C 4/02 |
| | | | 427/255.7 |
| 5,683,825 A | 11/1997 | Bruce et al. | |
| 6,544,665 B2 | 4/2003 | Rigney et al. | |
| 6,723,674 B2 * | 4/2004 | Wang | B82Y 30/00 |
| | | | 501/103 |
| 6,794,059 B2 * | 9/2004 | Shanker | C23C 4/02 |
| | | | 416/241 B |
| 6,827,969 B1 * | 12/2004 | Skoog | C23C 18/04 |
| | | | 427/140 |
| 7,150,926 B2 | 12/2006 | Strangman | |
| 7,368,164 B2 | 5/2008 | Stowell et al. | |
| 7,780,832 B2 | 8/2010 | Hasz | |
| 7,833,586 B2 | 11/2010 | Margolies | |
| 2002/0094448 A1 | 7/2002 | Rigney et al. | |
| 2004/0115470 A1 | 6/2004 | Ackerman et al. | |
| 2004/0170849 A1 | 9/2004 | Ackerman et al. | |
| 2005/0013994 A1 | 1/2005 | Strangman | |
| 2005/0282020 A1 | 12/2005 | Stowell et al. | |
| 2006/0068189 A1 * | 3/2006 | Raybould | C23C 4/18 |
| | | | 428/307.3 |
| 2007/0119713 A1 | 5/2007 | Hasz | |
| 2007/0141269 A1 | 6/2007 | Stowell et al. | |
| 2009/0110903 A1 | 4/2009 | Margolies | |
| 2009/0110953 A1 | 4/2009 | Margolies | |
| 2009/0123291 A1 | 5/2009 | Gensler et al. | |
| 2009/0324989 A1 * | 12/2009 | Witz | C23C 4/10 |
| | | | 428/613 |
| 2010/0136349 A1 * | 6/2010 | Lee | C04B 41/009 |
| | | | 428/446 |
| 2011/0151132 A1 | 6/2011 | Nagaraj et al. | |
| 2011/0151219 A1 | 6/2011 | Nagaraj et al. | |
| 2013/0130052 A1 | 5/2013 | Menuey et al. | |

FOREIGN PATENT DOCUMENTS

| | | |
|---|---|---|
| EP | 1428902 A1 | 6/2004 |
| EP | 1609885 A1 | 12/2005 |
| EP | 2053141 A1 | 4/2009 |
| EP | 2062999 A2 | 5/2009 |
| EP | 2631321 A1 | 8/2013 |
| WO | 2007017488 A1 | 2/2007 |

* cited by examiner

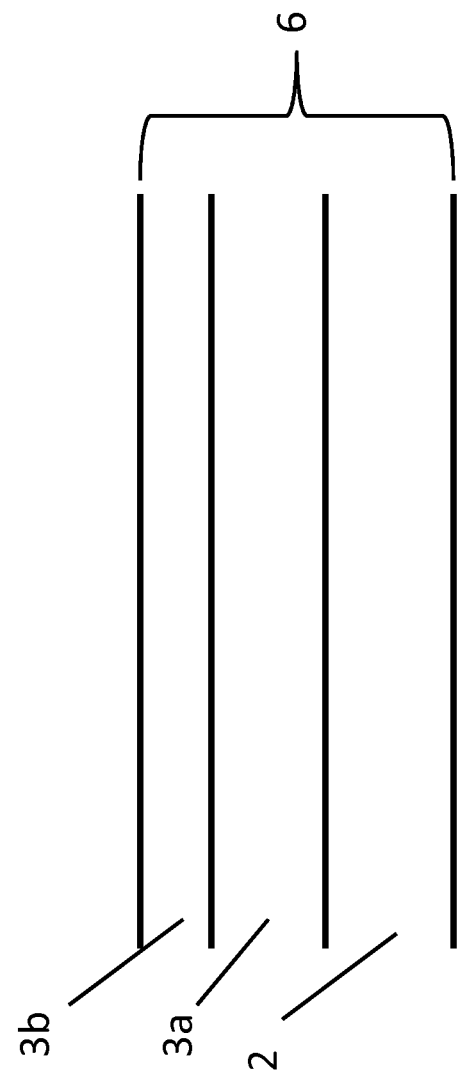

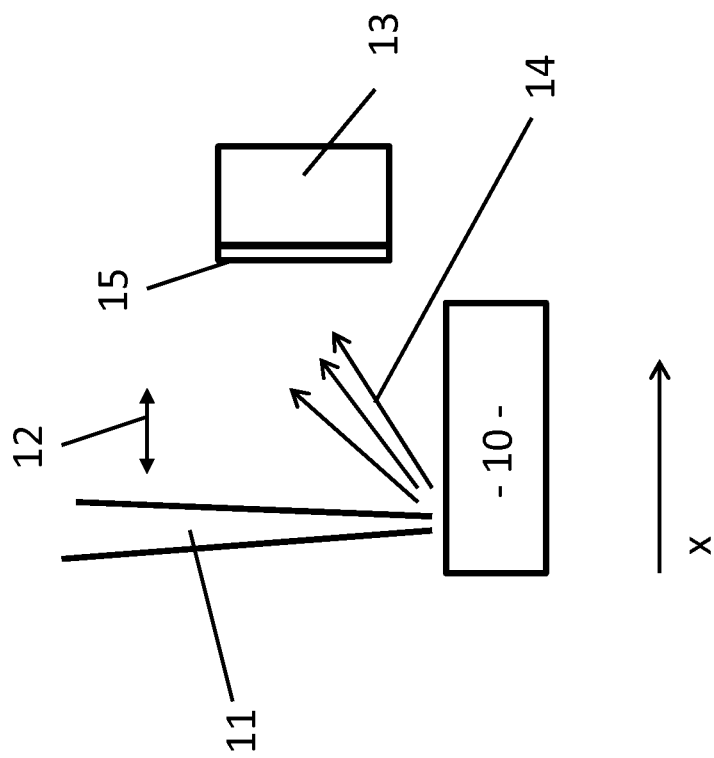

CMAS-INERT THERMAL BARRIER LAYER AND METHOD FOR PRODUCING THE SAME

CROSS-REFERENCE TO RELATED APPLICATIONS

The present application claims priority under 35 U.S.C. § 119 of German Patent Application No. 102013213742.7, filed Jul. 12, 2013, the entire disclosure of which is expressly incorporated by reference herein.

BACKGROUND OF THE INVENTION

1. Field of the Invention

The present invention relates to a method for producing a thermal barrier layer or coating for a metallic component, and also to a corresponding barrier layer or coating for a metallic component.

2. Discussion of Background Information

Turbomachines, such as stationary gas turbines and aircraft engines, are operated at ever higher temperatures for the purpose of boosting efficiency, meaning that components in the hot gas-affected region of the combustion chambers and of the high-pressure turbine require protection by means of active cooling and of thermal barrier coating (TBC) systems.

Known TBC systems encompass a metallic adhesion and/or antioxidation coat based on MCrAlY, where M stands for a metal such as nickel, cobalt, or iron. As a result of the corresponding chromium and aluminum fraction, a coat of this kind offers protection from oxidation and improves the adhesive strength of a ceramic coat, which is disposed on the outside in the thermal barrier coating system and which customarily consists of yttrium-stabilized zirconium oxide (YSZ).

Although thermal barrier coatings of this kind already have outstanding properties, there is a problem in that aircraft engines can be subject to massive sand and dust exposures, such as ash particles or industrially induced dusts, for example. On the basis of their composition, such sand and dust exposures are also referred to as CMAS (calcium magnesium aluminum silicates).

At high temperatures, such dusts become liquid, and then interact with the thermal barrier coating by infiltrating micro-fissures or open pores in the outer ceramic coat of the thermal barrier coating. As a result there is embrittlement and corresponding failure of the thermal barrier coating and/or in particular, of the ceramic coat, meaning that the components protected by the thermal barrier coating must be replaced and/or repaired. This results in considerable effort and cost, and so the thermal barrier coatings require protection against CMAS damage.

Already known are measures for protecting the thermal barrier coatings from CMAS damage: through arrangement of reactive oxides above or in the outer region of the ceramic coat of the thermal barrier coating, the intention is to produce protection by using reaction of the liquefied CMAS with the reactive oxides to form a stable crystalline layer on the thermal barrier coating, this layer providing protection from further CMAS attack. Examples of protective measures of these kinds are given, for example, in EP 1 428 902 A1, EP 0 783 043 A1, US 2004/0170849 A1, U.S. Pat. Nos. 5,660,885, 7,780,832, 5,338,577, and 7,833,586, and in Julie M. Drexler et al., Air-Plasma-sprayed thermal barrier coatings that are resistant to high-temperature attack by glassy deposits, Acta Materialia 58 (2010) 6835 to 6844. The entire disclosures of the mentioned documents are incorporated by reference herein.

The last-mentioned publication proposes providing not only aluminum but also titanium in solid solution in yttrium-stabilized zirconium oxide, with corresponding ceramic coats being generated by atmospheric plasma spraying (APS) or suspension plasma spraying (SPS). The aim of incorporating aluminum and titanium into the glassy CMAS melt is to bring about crystallization, so that the glassy melt is no longer able to penetrate the thermal barrier coating. The aluminum and titanium, however, is in solid solution in the $ZrO_2$ ceramic of the ceramic coat, and so first of all the aluminum and titanium must be taken up from the ceramic coat of the thermal barrier coating by the glassy CMAS melt. This, however, is disadvantageous for efficient provision of a protective effect relative to CMAS melts.

It would therefore be advantageous to be able to provide a thermal barrier layer or coating and a method for producing the same that affords effective protection against CMAS melts, it being at the same time simple to produce such a thermal barrier coating.

SUMMARY OF THE INVENTION

The present invention provides a method for forming a thermal barrier layer for a metallic component which involves formation of a ceramic coat, wherein aluminum oxide and titanium oxide are disposed at least in part in the ceramic coat. The method comprises the introduction of the aluminum oxide and the titanium oxide by (i) infiltration of aluminum-containing and titanium-containing particles or substances or by (ii) physical vapor deposition.

In one aspect of the method, for variant (i) the aluminum oxide particles and the titanium oxide particles or the aluminum-containing and titanium-containing particles or substances may be employed in the form of nanoparticles having an average grain size or maximum size of up to 200 nm, e.g., up to 50 nm, or from 15 nm to 30 nm.

In another aspect, infiltration may be carried out by application or immersion into a suspension or by a sol-gel method or by electrophoresis or electrolysis and/or the aluminum oxide particles and titanium oxide particles and/or the aluminum-containing and titanium-containing particles or substances may be present in an aqueous or alcoholic suspension and/or the ceramic coat may be immersed into a suspension for about 0.25 to about 30 hours, e.g., from about 0.5 to about 20 hours and may subsequently be dried for up to about two hours, e.g., for up to about 1 hour, at a temperature of up to about 500° C., e.g., up to about 250° C., or up to about 200° C.

In yet another aspect of the method of the instant invention, the aluminum-containing starting material may comprise at least one component selected from aluminum alkoxides, aluminum β-diketones, aluminum alkyls, aluminum sols, aluminum methoxide, aluminum propoxide, aluminum isopropoxide, aluminum butoxides, aluminum sec-butoxide, aluminum tributoxide, and aluminum-containing organometallic solutions and/or the titanium-containing starting material may be formed from titanium-containing organometallic solutions.

In a still further aspect, the ceramic coat may be infiltrated one or more times, e.g., up to four times, for in each case up to about two hours, e.g., up to about one hour or up to about 30 minutes, and may subsequently be stored at temperatures from about 200° C. to about 800° C., e.g., from about 300° C. to about 600° C., for about 0.5 to about 2 hours, e.g., for about one hour, and subsequently at temperatures from about 600° C. to about 1000° C., e.g., from about 700° C. to about 900° C., for about one to about four hours, e.g., for about 1.5 to about 3 hours, or for about 2 hours.

In another aspect, the aluminum oxide and the titanium oxide may be introduced only in an outer region of the ceramic coat and/or the aluminum oxide and the titanium oxide may be deposited simultaneously with the deposition of the ceramic coat.

In another aspect, the ceramic coat may comprise at least two subcoats, a first subcoat without aluminum oxide and titanium oxide and a second subcoat comprising aluminum oxide and titanium oxide, the transition from one subcoat to the other subcoat being continuous or discontinuous, either due to continuous alteration of material deposited during deposition or by deposition, after deposition of the first subcoat of the ceramic coat, of the second subcoat with altered composition.

In another aspect of the method, deposition may be carried out by electron beam or laser beam vaporization or by sputtering.

In another aspect, a material with locally different composition may be vaporized by physical vapor deposition for the deposition of the ceramic coat.

In another aspect, zirconium oxide stabilized with at least one of yttrium, yttrium oxide, calcium, or magnesium may be deposited as ceramic coat.

The present invention also provides a thermal barrier layer for a metallic component. The thermal barrier layer comprises a ceramic coat in which aluminum oxide and titanium oxide are disposed at interfaces within the coat and/or in an outer topcoat region.

In one aspect of the layer, the interfaces may comprise at least one of fissure edges, grain boundaries, and surfaces of pores.

In another aspect, the outer topcoat region may comprise up to 30 wt %, e.g., up to 20 wt % of aluminum and up to 10 wt %, e.g., up to 5 wt % of titanium oxide.

The launch point for the invention is the idea that, as reactive oxide for reaction with CMAS melts, not only aluminum oxide but additionally titanium oxide is to be provided, in order to enhance the protective effect through reaction with the CMAS melt and formation of a crystalline surface layer. Instead of the solution proposed in the prior art, however, namely that of providing titanium oxide throughout the ceramic coat of the thermal barrier coating, what is proposed is the provision of titanium and the formation of titanium oxide particles in the surface region and more particularly at interfaces within the ceramic coat of the thermal barrier layer, meaning that the titanium and/or the titanium oxide particles or grains are available with precise direction at the same locations at which they are needed. The generation of aluminum oxide and titanium oxide in the near-surface region of the ceramic coat of a thermal barrier layer can be accomplished by infiltration of aluminum-containing and titanium-containing particles or substances or by physical vapor deposition of aluminum oxide and titanium oxide in the ceramic layer.

Through the infiltration of aluminum-containing and titanium-containing particles or substances it is possible to provide the aluminum and the titanium in precisely those surface regions in which they are needed for reaction with the CMAS melts. Moreover, a simple generation of aluminum oxide particles and titanium oxide particles is possible.

The same is true of the deposition of aluminum oxide and titanium oxide by physical vapor deposition in the outer marginal region of the ceramic layer, since in the case of physical vapor deposition it is easy to accomplish a variation in the chemical composition in the surface layer region, so that only in the surface region is titanium oxide additionally deposited, in conjunction with aluminum oxide, in the ceramic coat, whereas in deeper regions, disposed toward the base material, a ceramic coat without additions can be deposited, such as a pure yttrium-stabilized zirconium oxide coat, for example.

The infiltration method is particularly suited to ceramic layers having a relatively rough surface, such as ceramic layers generated by plasma spraying, for example, more particularly by atmospheric plasma spraying, whereas the introduction of aluminum and titanium and/or their oxides by means of physical vapor deposition can be employed preferentially for the production of smooth ceramic layers.

What is claimed, consequently, according to a first aspect of the invention, for which protection is sought independently and in combination with other aspects of the invention, is a method for forming a thermal barrier layer for a metallic component, which involves forming, more particularly by thermal spraying, a ceramic coat in which at least in part aluminum oxide and titanium oxide are disposed, the aluminum oxide and titanium oxide being introduced by infiltration of aluminum-containing and titanium-containing particles or substances or by physical vapor deposition.

In the case of the infiltration, aluminum oxide and titanium oxide particles, or aluminum and titanium comprising particles, can be used in the form of nanoparticles having an average or maximum grain size of up to 200 nm, more particularly up to 50 nm, preferably in the range from 15 to 30 nm.

The infiltration may be accomplished by applying a suspension which comprises aluminum oxide and titanium oxide particles or aluminum and titanium comprising particles to the ceramic coat, or by immersing the ceramic coat in such a suspension. Also possible is the use of sol-gel methods. A further possibility exists in the form of electrophoreses or electrolysis of aluminum-containing and titanium-containing substances to bring about deposition of aluminum-containing and titanium-containing particles, which can be converted into aluminum oxide particles and titanium oxide particles by subsequent treatment.

The aluminum oxide particles and titanium oxide particles and/or the aluminum-containing and titanium-containing substances may be present in an aqueous and/or alcoholic suspension.

In the infiltration, the ceramic coat may be immersed for 0.25 to 30 hours, preferably 0.5 to 20 hours, into the suspension, and subsequently dried for up to two hours, preferably for up to one hour, at a temperature of up to 500° C., more particularly of up to 250° C., preferably of up to 200° C., in the course of which oxidation of the particles introduced may also take place.

The aluminum-containing starting materials for an infiltration may encompass aluminum alkoxides, aluminum β-diketones, aluminum alkyls, aluminum sols, aluminum methoxides, aluminum propoxides, aluminum isopropoxides, aluminum butoxides, aluminum sec-butoxides, aluminum tributoxides and/or aluminum-containing organometallic compounds, while the titanium-containing starting materials may be provided on the basis of organometallic solutions.

The ceramic coat may be infiltrated one or more times, preferably up to four times, for in each case up to about two hours, preferably up to about one hour, more particularly up to about 30 minutes, and is then stored at temperatures from about 200° C. to about 800° C., preferably from about 300°

C. to about 600° C., more particularly at about 400° C., for about 0.5 to 2 hours, preferably about one hour, and subsequently at about 600° C. to about 1000° C., preferably at about 700° C. to about 900° C., more particularly at about 800° C., for about one to about four hours, preferably about 1.5 to about 3 hours, more particularly about 2 hours.

The aluminum oxide and the titanium oxide are introduced only into the outer region of the ceramic coat. This is also true, in particular, for the production of the thermal barrier layer, and more particularly of the ceramic coat of the thermal barrier layer, via physical vapor deposition.

Accordingly, the ceramic coat may comprise at least two subcoats, namely a subcoat without aluminum oxide and titanium oxide, and a subcoat with aluminum oxide and titanium oxide, the transition from one subcoat to the other subcoat being continuous or discontinuous, either by alteration of the deposited material continuously during deposition, or by deposition, following the deposition of a first subcoat of the ceramic coat, of a second subcoat with altered composition. The advantage of physical vapor deposition is therefore the simplicity of production, since the aluminum oxide and the titanium oxide can be deposited simultaneously with the deposition of the ceramic coat.

The physical vapor deposition may comprise deposition by electron beam vaporization or laser beam vaporization, or by sputtering.

The production of a two-layer ceramic coat with continuously altering composition may be realized through the use of a starting material with locally different composition. By vaporizing the material with different composition in a time sequence, it is possible in a simple way to generate a two-layer coat with interposed gradient coat for the continuous transition.

As ceramic layer or coat it is possible more particularly to select zirconium oxide stabilized with yttrium, with yttrium oxide, with calcium, or with magnesium.

According to a further aspect of the invention, for which protection is sought independently and in combination with other aspects of the invention, a thermal barrier layer is claimed for a metallic component, the thermal barrier layer comprising a ceramic coat in which aluminum oxide and titanium oxide are disposed at interfaces within the coat and/or in the outer topcoat region.

Interfaces contemplated in this context include, in particular, fissure edges, grain boundaries and/or surfaces of pores.

Aluminum oxide and titanium oxide may be present in the topcoat region with a fraction of up to about 30 wt % of aluminum, preferably up to about 20 wt % of aluminum, and a fraction of up to about 10 wt % of titanium oxide, more particularly up to about 5 wt % of titanium oxide.

BRIEF DESCRIPTION OF THE DRAWINGS

The appended drawings show in a purely diagrammatic way, in

FIG. 2 a cross-sectional view through a second embodiment of a thermal barrier layer of the invention; and FIG. 3 a diagrammatic representation of an apparatus for producing a thermal barrier layer of the invention.

DETAILED DESCRIPTION OF THE PRESENT INVENTION

Figure 1:
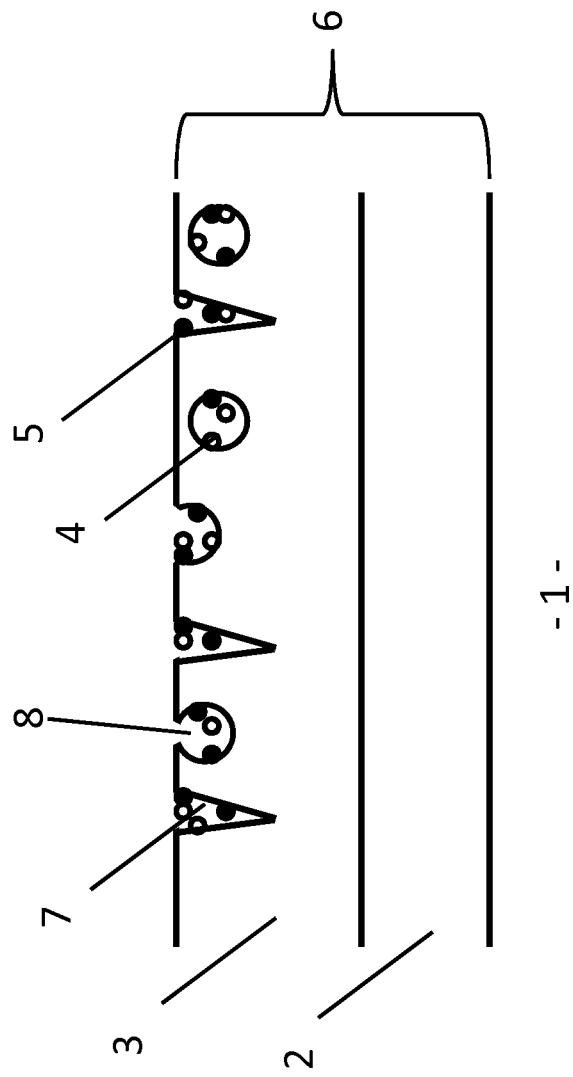
FIG. 1 a cross-sectional view through a first embodiment of a thermal barrier layer of the invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description in combination with the drawings making apparent to those of skill in the art how the several forms of the present invention may be embodied in practice.

FIG. 1 shows a cross-section through an inventive thermal barrier layer on a substrate 1.

The substrate 1 may be any desired metallic article, such as a turbine blade or an aircraft engine combustion chamber, for example.

The thermal barrier layer 6 comprises a metallic adhesion and/or antioxidation coat 2, which may be formed, for example, by a so-called MCrAlY layer, where M stands for a metal such as nickel, cobalt or iron, and ensures not only enhanced adhesion of the subsequent ceramic coat 3 on the substrate 1 but also protection to the substrate 1 from oxidation. Accordingly, the chromium and aluminum and also yttrium constituents may be selected in a suitable order of magnitude for achieving the desired properties.

Besides the metallic adhesion and/or antioxidation coat based on MCrAlY, the thermal barrier layer comprises a ceramic topcoat 3, which may be constructed from yttrium-stabilized zirconium oxide, for example, allowing $Y_2O_3$ particles to be intercalated in a $ZrO_2$ matrix in the ceramic coat 3.

The ceramic coat 3 usually has micro-fissures 7 or pores 8, which for purely diagrammatic reasons are shown with a certain over-dimensioning in the representation in FIG. 1.

In the inventive thermal barrier layer 6, aluminum oxide and titanium oxide particles are infiltrated in the micro-fissures 7 and the pores 8, and form, together with sand particles and ash particles and also with dusts referred to as CMAS (calcium magnesium aluminum silicates), a reaction layer, thereby forming a crystalline phase which in terms of the melting point, the hardness and the coefficient of thermal expansion behaves similarly to the yttrium-stabilized zirconium oxide. This prevents CMAS in liquid melt form from penetrating the thermal barrier coating and causing destruction of the thermal barrier coating.

FIG. 2 shows a further embodiment of an inventive thermal barrier coating, with constituents that are identical relative to the embodiment in FIG. 1 having the same reference symbols. Again, on a metallic substrate 1, there is a metallic adhesion and/or antioxidation coat 2 in the form of an MCrAlY coat, in which M again stands for iron, cobalt or nickel.

Applied above the metallic adhesion and/or antioxidation coat 2, as in the working example of FIG. 1, is a ceramic coat composed, for example, of yttrium-stabilized zirconium dioxide. The ceramic coat 3, however, is of two-part form, with a subcoat 3a, which is formed from the substantially pure yttrium-stabilized zirconium-oxide without significant further constituents, while in the outer subcoat 3b there are intercalated particles of aluminum oxide and of titanium oxide. In the case of the working example of FIG. 2, the ceramic coat 3 is applied by a PVD (physical vapor deposition) method, with only the outer subcoat 3b being deposited with an altered chemical composition.

For the application of the ceramic coat 3 by means of PVD methods it is possible, for example, to employ techniques such as electron beam vaporization or laser beam vaporization. In order to achieve a different chemical composition in the subcoats 3a and 3b, all that is needed is to select the starting material in a correspondingly different manner. This may be realized on the one hand by a change in the corresponding starting material, or by the use of a starting material with locally different composition and with melting and vaporization of the starting material by means of the electron beam or laser beam in different regions of the starting material.

FIG. 3 shows, in a diagrammatic representation, an apparatus with which it is possible to produce a thermal barrier layer according to FIG. 2.

FIG. 3 shows the starting material 10, also referred to as target, and an electron beam or laser beam 11, with which the starting material 10 is melted, so that the material vaporizes as illustrated by the arrows 14 and is deposited again as a surface coat 15 on a component 13 that is to be coated. The possibility of moving the laser beam or electron beam 11, as indicated by the double arrow 12, means that the melting and vaporizing of the starting material can take place at different locations in the starting material, and so, in the case of a locally changing chemical composition of the starting material, different material is evaporated and is deposited in the surface coat 15 on the component that is to be coated. If, for example, the chemical composition of the starting material 10 changes continuously along the X-direction, then material with different composition can be vaporized if the electron beam or laser beam 11 is moved along the X-direction, thereby resulting in deposition on the component 13 of a coat 15 which changes continuously in its composition. Accordingly, a gradient coat can be formed as ceramic coat 6, in which continuously the composition is altered from a pure zirconium oxide and yttrium oxide coat into an yttrium-stabilized zirconium oxide coat enriched with aluminum oxide and titanium oxide.

While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method of modifying a thermal barrier layer arranged on a metallic component, wherein the thermal barrier layer comprises a ceramic coat and the method comprises incorporating aluminum oxide and titanium oxide in the ceramic coat by infiltrating the ceramic coat with aluminum-containing and titanium-containing particles or substances, the aluminum oxide and the titanium oxide being incorporated only in an outer region of the ceramic coat.

2. The method of claim 1, wherein aluminum oxide particles and titanium oxide particles or the aluminum-containing and titanium-containing particles or substances are employed in the form of nanoparticles having an average grain size or maximum size of up to 200 nm.

3. The method of claim 1, wherein infiltration is carried out by application of or immersion into a suspension or by a sol-gel method or electrophoresis or electrolysis.

4. The method of claim 3, wherein aluminum oxide particles and titanium oxide particles and/or the aluminum-containing and titanium-containing particles or substances are present in an aqueous or alcoholic suspension.

5. The method of claim 3, wherein the ceramic coat is immersed into a suspension for about 0.25 to about 30 hours and is subsequently dried for up to about two hours, at a temperature of up to about 500° C.

6. The method of claim 1, wherein an aluminum-containing starting material comprises at least one component selected from aluminum alkoxides, aluminum β-diketones, aluminum alkyls, aluminum sols, aluminum methoxide, aluminum propoxide, aluminum isopropoxide, aluminum butoxides, aluminum sec-butoxide, aluminum tributoxide, and aluminum-containing organometallic solutions and/or wherein a titanium-containing starting material is formed from titanium-containing organometallic solutions.

7. The method of claim 1, wherein the ceramic coat is infiltrated one or more times for in each case up to about two hours, and is subsequently kept at temperatures from about 200° C. to about 800° C. for about 0.5 to about 2 hours, and subsequently at temperatures from about 600° C. to about 1000° C. for about one to about four hours.

8. The method of claim 1, wherein aluminum oxide and titanium oxide are disposed at interfaces within the ceramic coat and/or in an outer topcoat region.

9. The method of claim 8, wherein the interfaces comprise one or more of fissure edges, grain boundaries, pore surfaces.

10. The method of claim 1, wherein the ceramic coat comprises zirconium oxide stabilized with at least one of yttrium, yttrium oxide, calcium, magnesium.

11. A method of forming or modifying a thermal barrier layer arranged on a metallic component, wherein the thermal barrier layer comprises a ceramic coat and the method comprises forming a ceramic coat having aluminum oxide and titanium oxide incorporated therein by physical vapor deposition wherein the aluminum oxide and titanium oxide are incorporated only in an outer region of the ceramic coat.

12. The method of claim 11, wherein the aluminum oxide and the titanium oxide are deposited simultaneously with material for forming the ceramic coat.

13. The method of claim 11, wherein the ceramic coat comprises at least two subcoats, a first subcoat without aluminum oxide and titanium oxide and a second subcoat comprising aluminum oxide and titanium oxide, a transition from one subcoat to the other subcoat being continuous or discontinuous, either due to continuous alteration of material deposited during deposition or by deposition, after deposition of the first subcoat of the ceramic coat, of the second subcoat with altered composition.

14. The method of claim 11, wherein the deposition is carried out by electron beam or laser beam vaporization.

15. The method of claim 11, wherein the deposition is carried out by sputtering.

16. The method of claim 12, wherein a material with locally different composition is vaporized by physical vapor deposition for the deposition of the ceramic coat.

17. The method of claim 11, wherein the ceramic coat comprises zirconium oxide stabilized with at least one of yttrium, yttrium oxide, calcium, magnesium.

18. The method of claim 11, wherein aluminum oxide and titanium oxide are disposed at interfaces within the ceramic coat and/or in an outer topcoat region.

19. The method of claim 18, wherein the interfaces comprise one or more of fissure edges, grain boundaries, pore surfaces.

* * * * *